United States Patent [19]

Nishiyama et al.

[11] 4,445,066
[45] Apr. 24, 1984

[54] ELECTRODE STRUCTURE FOR A ZINC OXIDE THIN FILM TRANSDUCER

[75] Inventors: Hiroshi Nishiyama, Mukoh; Takeshi Nakamura, Uji, both of Japan

[73] Assignee: Murata Manufacturing Co., Ltd., Nagaokakyo, Japan

[21] Appl. No.: 509,028

[22] Filed: Jun. 29, 1983

[30] Foreign Application Priority Data

Jun. 30, 1982 [JP] Japan ................... 57-114446
Jun. 30, 1982 [JP] Japan ................... 57-114447
Jun. 30, 1982 [JP] Japan ................... 57-114448
Jun. 30, 1982 [JP] Japan ................... 57-114449
Jun. 30, 1982 [JP] Japan ................... 57-114450
Jun. 30, 1982 [JP] Japan ................... 57-114451

[51] Int. Cl.$^3$ ........................................... H01L 41/08
[52] U.S. Cl. ................................. 310/364; 310/321
[58] Field of Search ............. 310/321, 364, 363, 324, 310/370

[56] References Cited

U.S. PATENT DOCUMENTS 3,486,046 12/1969 Zalar ................................. 310/324

FOREIGN PATENT DOCUMENTS 51-3183 1/1976 Japan ................................. 310/364
55-49020 4/1980 Japan ................................. 310/364

Primary Examiner—Mark O. Budd
Attorney, Agent, or Firm—Finnegan, Henderson, Farabow, Garrett & Dunner

[57] ABSTRACT

An Al electrode structure for a zinc oxide thin film in which an intermediate layer of $V_2O_3$, Ta, V, Cu, Ni or Ti is provided between the surface of the zinc oxide thin film and the Al electrode. A tuning fork vibrator equipped with such an electrode structure has high reliability in that changes in resonance frequency and series resonance resistance (Ro) with time are small.

6 Claims, 20 Drawing Figures

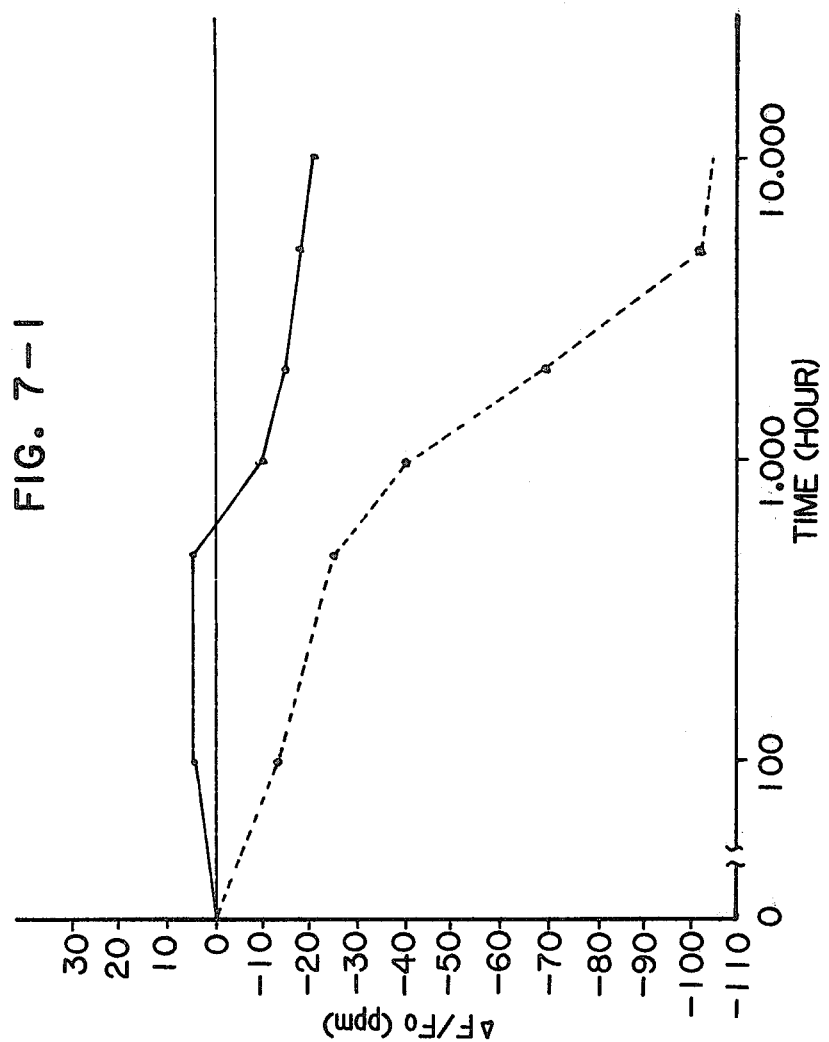

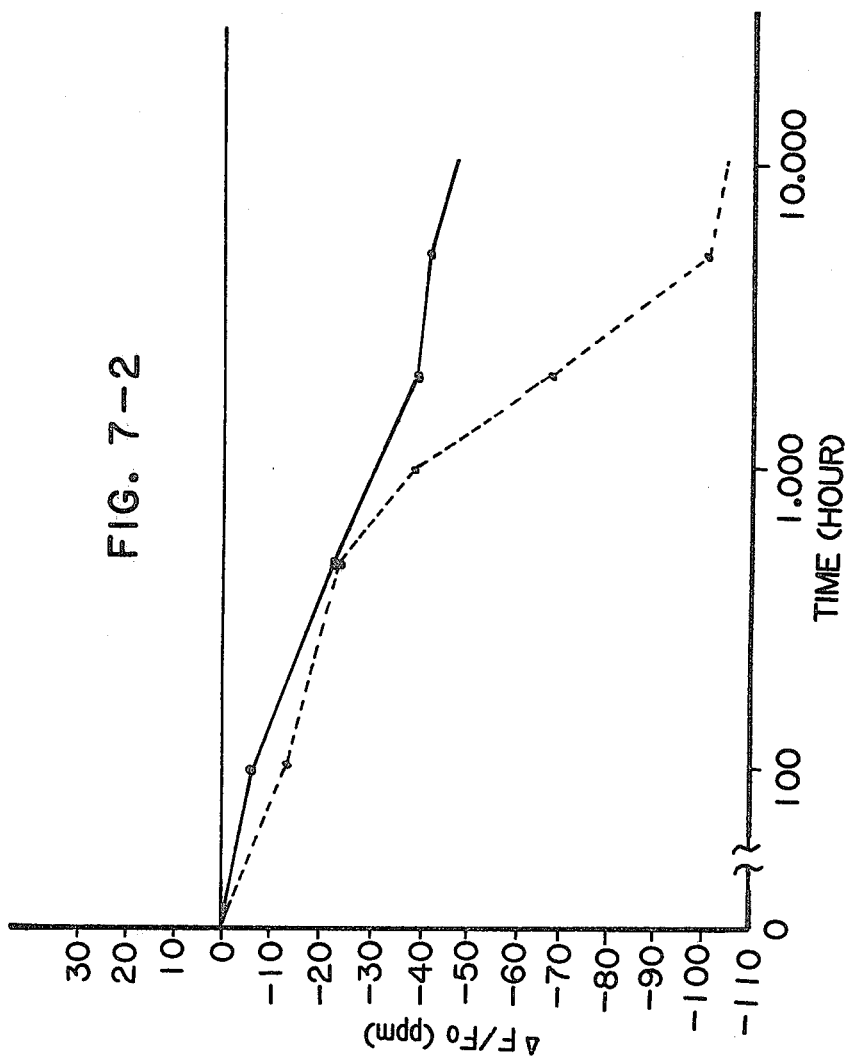

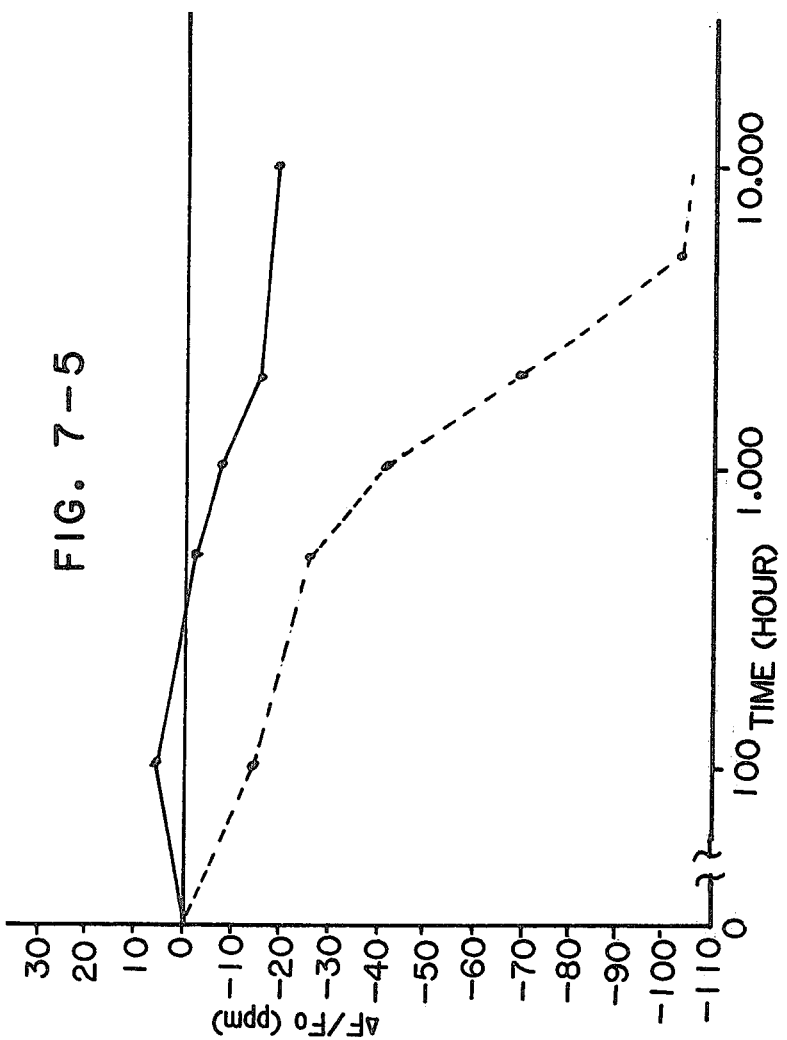

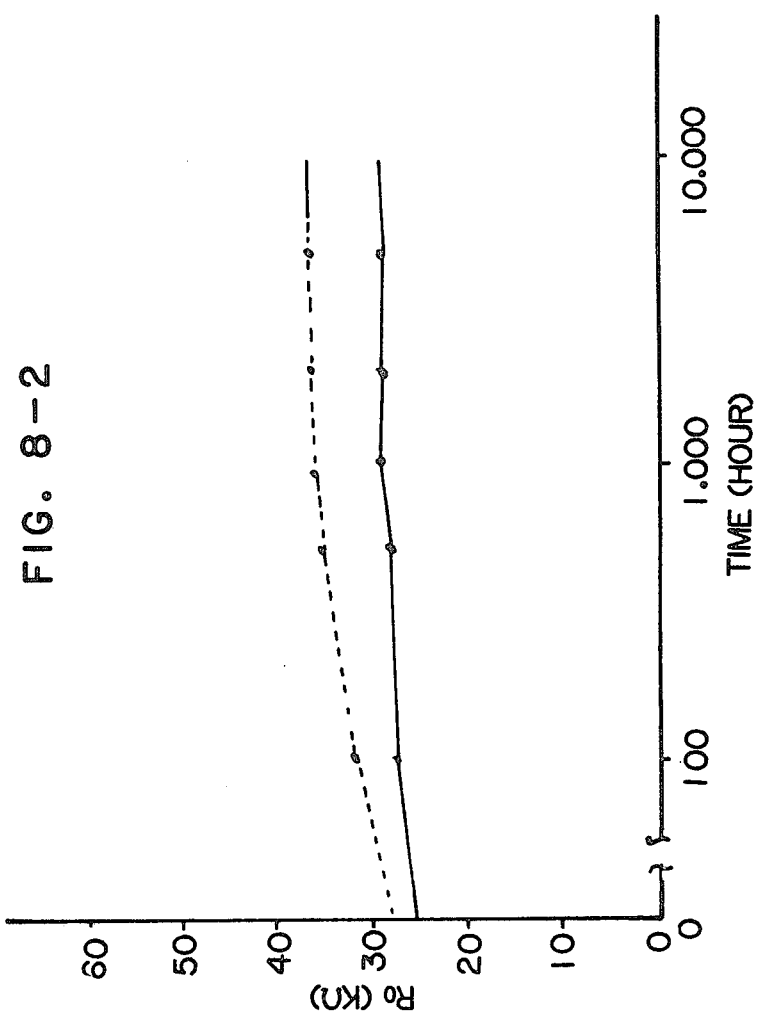

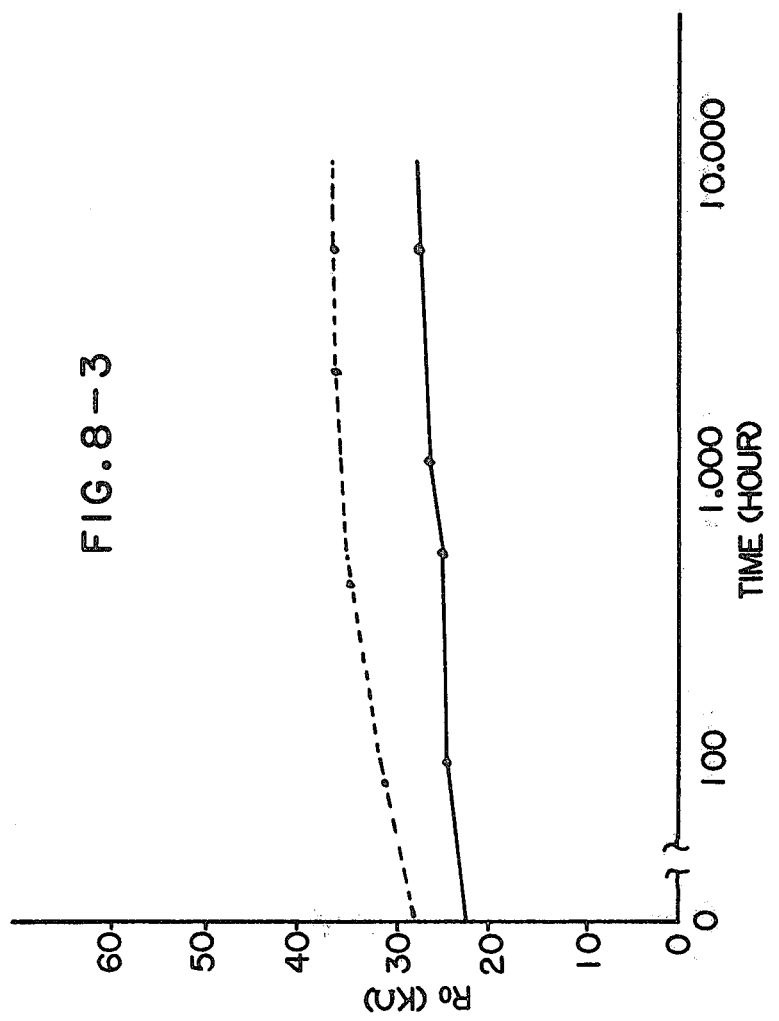

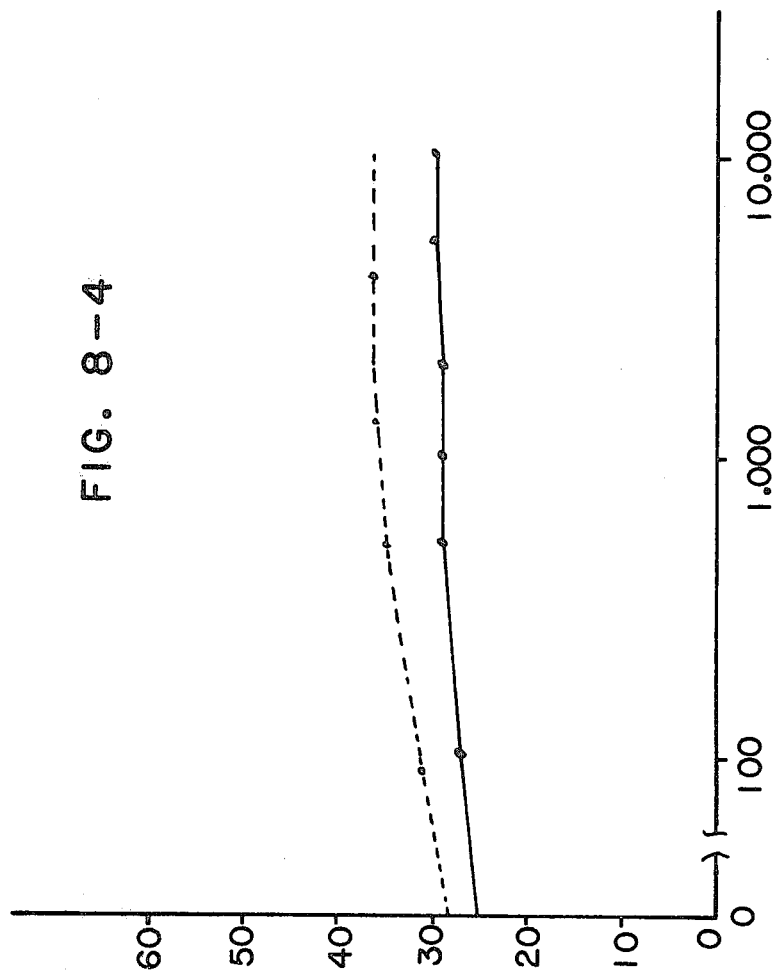

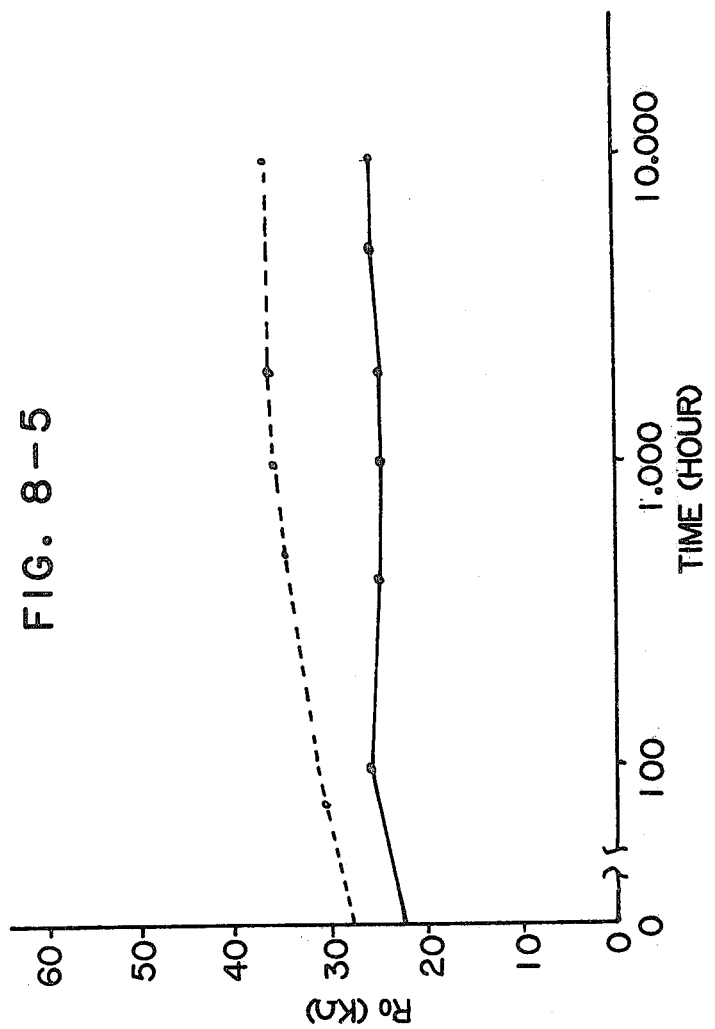

ELECTRODE STRUCTURE FOR A ZINC OXIDE THIN FILM TRANSDUCER

FIELD OF THE INVENTION

The present invention relates to an electrode structure for a zinc oxide thin film having stable electrical characteristics.

BACKGROUND OF THE INVENTION

Zinc oxide thin films have been used as a piezoelectric material for such devices as a surface acoustic wave device, a tuning fork vibrator or a tuning bar vibrator.

In FIG. 1, in side view, there is shown an example of a tuning fork vibrator having a zinc oxide thin film as a piezoelectric material. This tuning fork vibrator includes a main body 1 having leg portions 2 and 3, zinc oxide thin films 4 and 5 formed on the respective side walls 2a and 3a of leg portions 2 and 3 and Al base electrodes 6 and 7 formed on zinc oxide thin films 4 and 5. The zinc oxide thin films 4 and 5 can be formed by a chemical vapor deposition or a physical vapor deposition process such as vacuum deposition, sputtering or ion plating.

As the electrodes 6 and 7, Al is selected because it is inexpensive and can be easily bonded, and further, it is generally applied in I.C. The Al layer can be formed in a film thickness ranging between 3,000 Å and 10,000 Å by techniques such as electron beam heating deposition.

These conventional electrode structures for zinc oxide thin films, however, have the following defects. Since the Al base electrode itself has a high affinity, the Al diffuses into the zinc oxide thin film, causing a deterioration in the film's electrical characteristics. The diffusion of 3-valent Al in zinc oxide, a 2-valent semiconductor, causes the electrical characteristics of the zinc oxide thin film to deteriorate, e.g., it can seriously change its resonance frequency. When the Al electrode is subjected to a high temperature life test, the effect is accelerated and the deterioration of the electrical characteristics is further increased.

It has therefore been desirable to develop an improved Al electrode structure for zinc oxide thin films.

SUMMARY OF THE INVENTION

Accordingly, an object of the present invention is to provide an Al electrode structure for a zinc oxide thin film that has stable electrical characteristics.

This object can be achieved in an Al electrode structure for a zinc oxide thin film, by providing an intermediate layer between the surface of the zinc oxide thin film and the Al electrode in which the intermediate layer is selected from the group consisting of $V_2O_3$, Ta, V, Cu, Ni or Ti.

BRIEF DESCRIPTION OF THE DRAWINGS

FIGS. 7-1 to 7-6 are each a graph plotting resonance frequency vs. time;

FIGS. 8-1 to 8-6 are each a graph plotting Ro vs. time;

DETAILED DESCRIPTION OF THE INVENTION

It is to be understood that both the foregoing general description and the following detailed description are exemplary and explanatory but are not restrictive of the invention. The present invention will now be described in detail by reference to the accompanying drawings.

Figure 2:
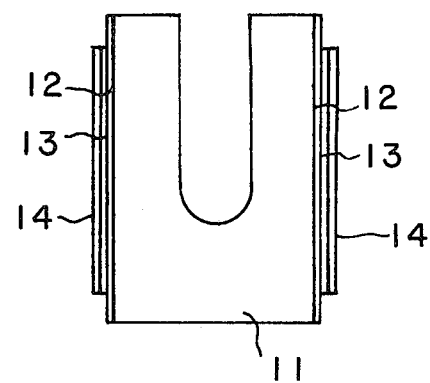
FIG. 2 is a side view of a tuning fork vibrator equipped with the electrode structure of the present invention for a zinc oxide thin film.

FIG. 2 is a side view of a tuning fork vibrator equipped with an electrode structure of the present invention. This tuning fork vibrator comprises a metal tuning fork 11 made of, e.g., Elinvar, which consists of 42 wt % of Ni, 5.4 wt % of Cr, 2.4 wt % of Ti, 0.001 wt % of C, 0.5 wt % of Mn, 0.6 wt % Si, 0.6 wt % of Al and the balance of Fe. A zinc oxide thin film 12, an intermediate layer 13, and an Al electrode 14 are provided on each leg of the vibrator. The intermediate layer 13 can be formed by techniques such as an electron beam heating deposition process, a sputtering process, an ion beaming process, a resistance heating deposition process and an ion plating process. The intermediate layer preferably has a thickness of from 50 to 3000 Å.

Figure 3:
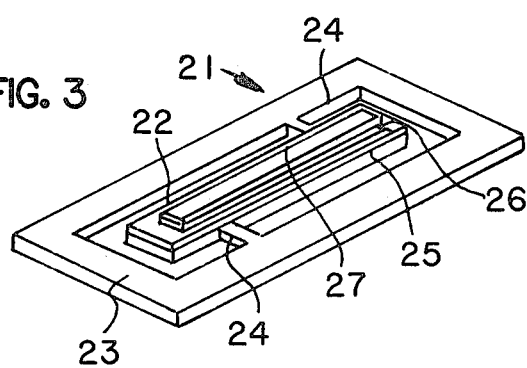
FIG. 3 is a perspective view of a tuning bar vibrator equipped with the electrode structure of the present invention for a zinc oxide thin film.

FIG. 3 is a perspective view of a tuning bar vibrator of bending mode, provided with an electrode structure of the present invention. The main body of tuning bar vibrator 21 comprises basically a vibrator 22 and a frame 23 supporting the vibrator 22 by supports 24. On the vibrator 22 are provided a zinc oxide thin film 25, an intermediate layer 26, and an Al electrode 27 in that order.

Figure 4:
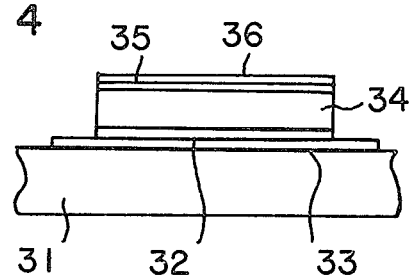
FIGS. 4-6 are each a side view of a vibrator equipped with the electrode structure of the present invention for a zinc oxide thin film.

FIG. 4 is a side view of another vibrator of bending mode equipped with an electrode structure of the present invention. This vibrator comprises a substrate 31 made of, for example, ceramics, plastics, or rubber, and an Al electrode 32, an intermediate layer 33, a zinc oxide thin film layer 34, an intermediate layer 35, and an Al electrode 36, all provided on the substrate 31 in that sequence.

Figure 5:
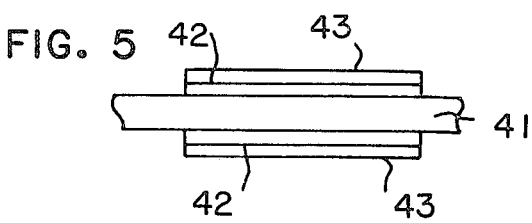

FIG. 5 is a side view of a vibrator of extension mode equipped with an electrode structure of the present invention. This vibrator comprises a zinc oxide thin film 41, and intermediate layers 42—42 and Al electrodes 43—43 formed on both sides of the zinc oxide thin film 41 in that sequence.

Figure 6:
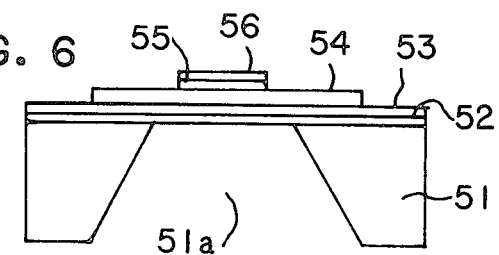

FIG. 6 is a side view of a vibrator of thickness mode equipped with an electrode structure of the present invention. This vibrator comprises a substrate 51 made of, for example, Si, $SiO_2$ or the like and an Al electrode 52 and an intermediate layer 53 provided in that order on substrate 51. In addition, a zinc oxide thin film 54 is formed on the intermediate layer 53. An empty space 51a is formed in substrate 51 at a position corresponding to that where the zinc oxide thin film 54 is provided with an intermediate layer 55 and an Al electrode 56 laminated on zinc oxide thin film 54 in that order.

The electrode structure of the present invention will hereinafter be explained in greater detail by reference to FIG. 2. After the zinc oxide thin films 12 are formed on the vibrator 11 by a sputtering process, the intermediate layers 13 are formed on the zinc oxide thin films 12. In this step, when the intermediate layer 13 is $V_2O_3$, the layer is formed in a thickness of 600 Å by a resistance heating deposition process. When the layer is Ta, the layer formed has a thickness of 150 Å by an electron beam heating deposition process. When the layer is V, the layer formed has a thickness of 430 Å by a resistance heating deposition process. Finally, when the layer is Cu, Ni or Ti, the layer is formed in a thickness of 500 Å, 350 Å and 300 Å respectively, by an electron beam heating deposition process. Preferred intermediate layers 13 are V or $V_2O_3$. The Al base electrodes 14 are then formed on the intermediate layers 13 in a thickness of 10,000 Å by an electron beam heating deposition process. In this way, a vibrator having a resonance frequency of 32 KHz was produced.

The vibrator was allowed to stand at a temperature of 120° C. for 10,000 hours while applying a D.C. voltage of 20 V. During the period, the life characteristic of resonance frequency was measured. This measurement was performed for 20 samples. For comparison, a vibrator having the same structure as above except that an intermediate layer was not provided was also produced and tested in the same manner.

Figure 1:
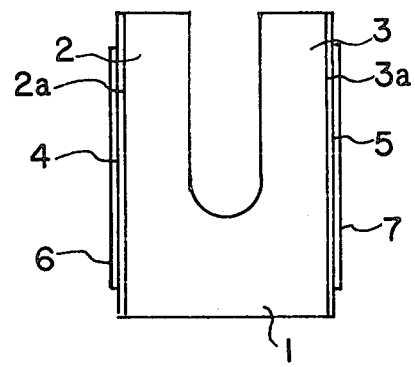
FIG. 1 is a side view of a prior art tuning fork vibrator.
Figures 3, 7:
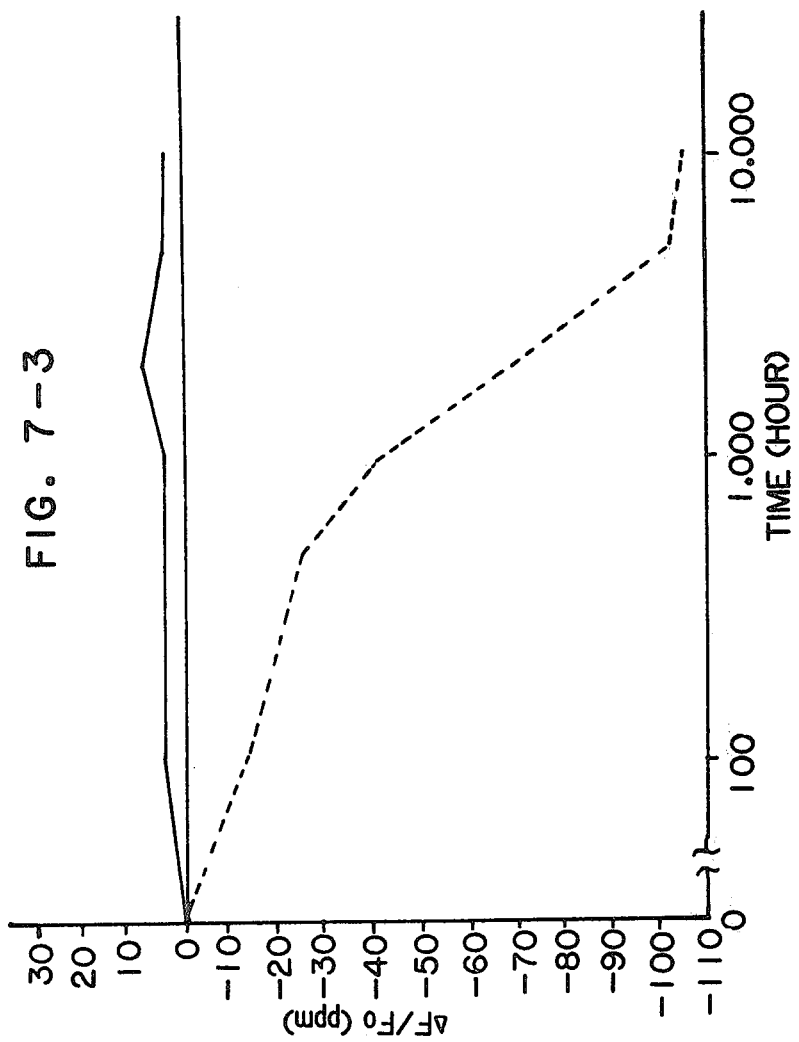
Figures 4, 7:
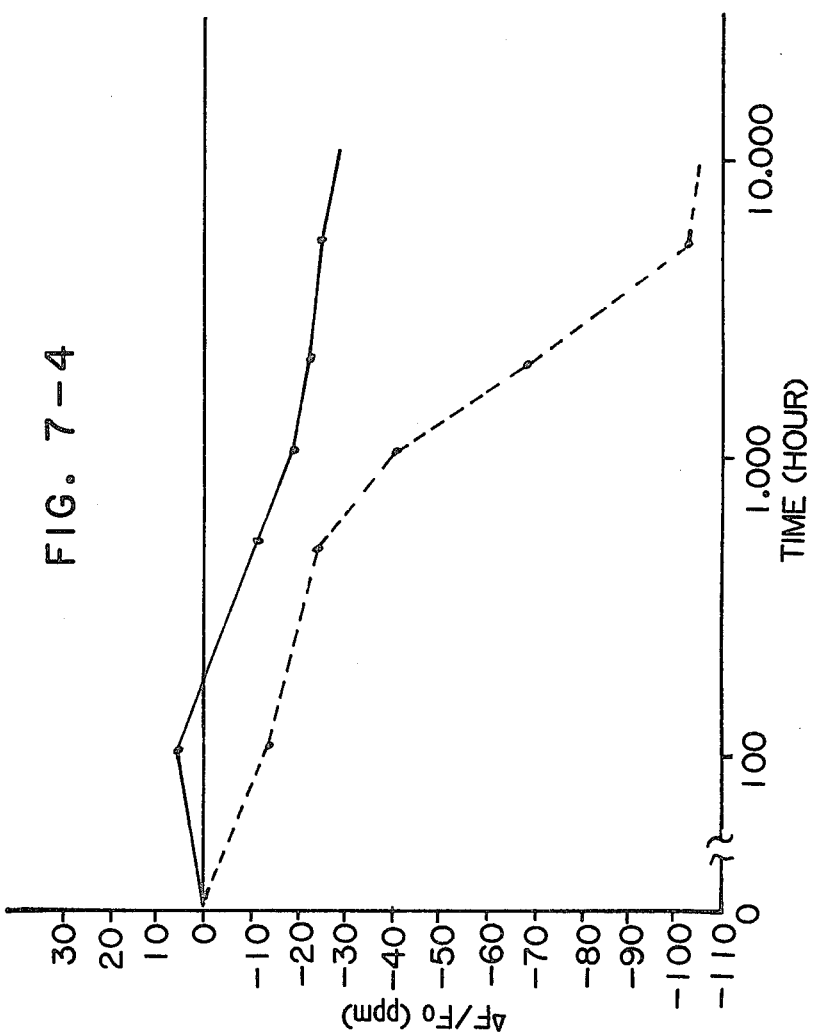
Figures 6, 7:
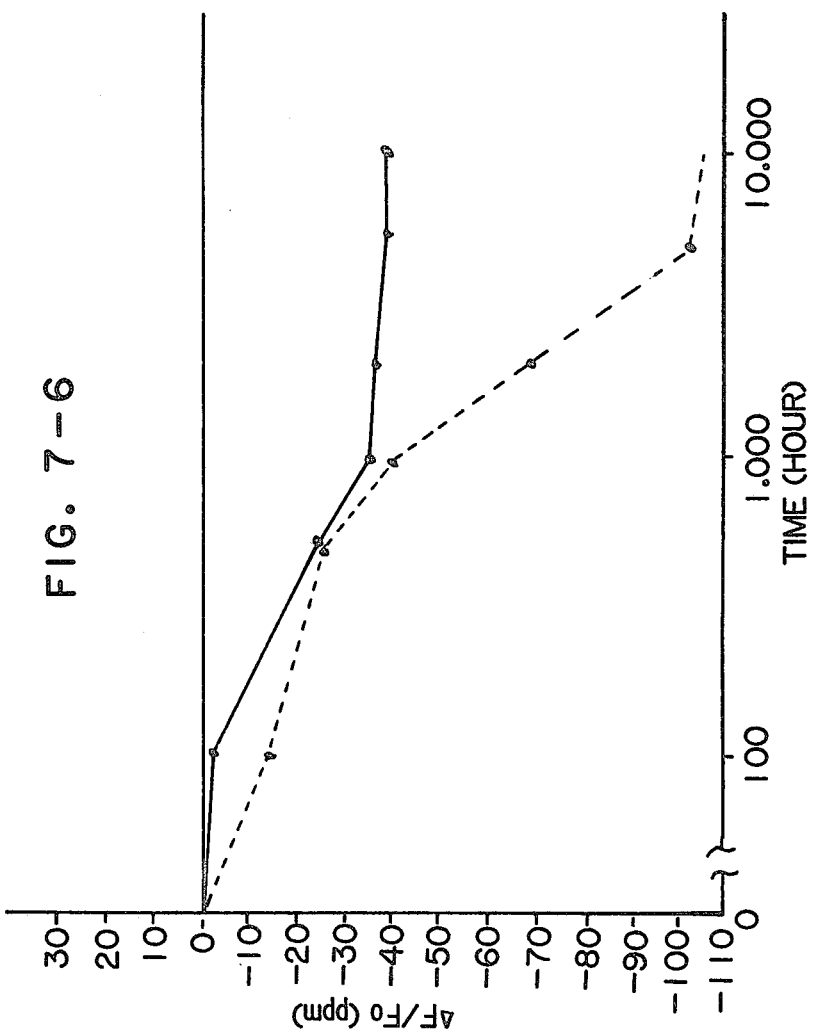

The results are shown in FIGS. 7-1 to 7-6. In these figures, the value of life characteristic of resonance frequency ($\Delta F/Fo$) as defined below is plotted against time.

$$\Delta F/Fo = \frac{\text{Resonance Frequency} - \text{Initial Resonance Frequency}}{\text{Initial Resonance Frequency}} \text{ (ppm)}$$

In FIGS. 7-1 to 7-6, the samples constructed according to the present invention are indicated by a solid line and the comparative samples by a dotted line.

Figures 1, 8:
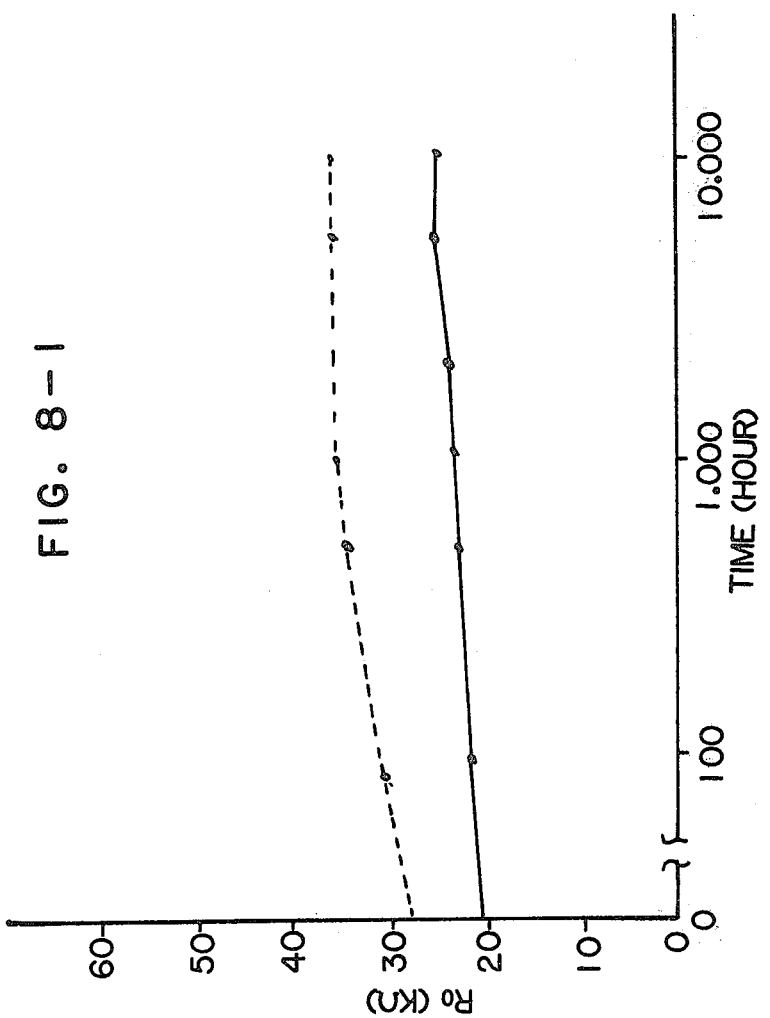
Figures 6, 8:
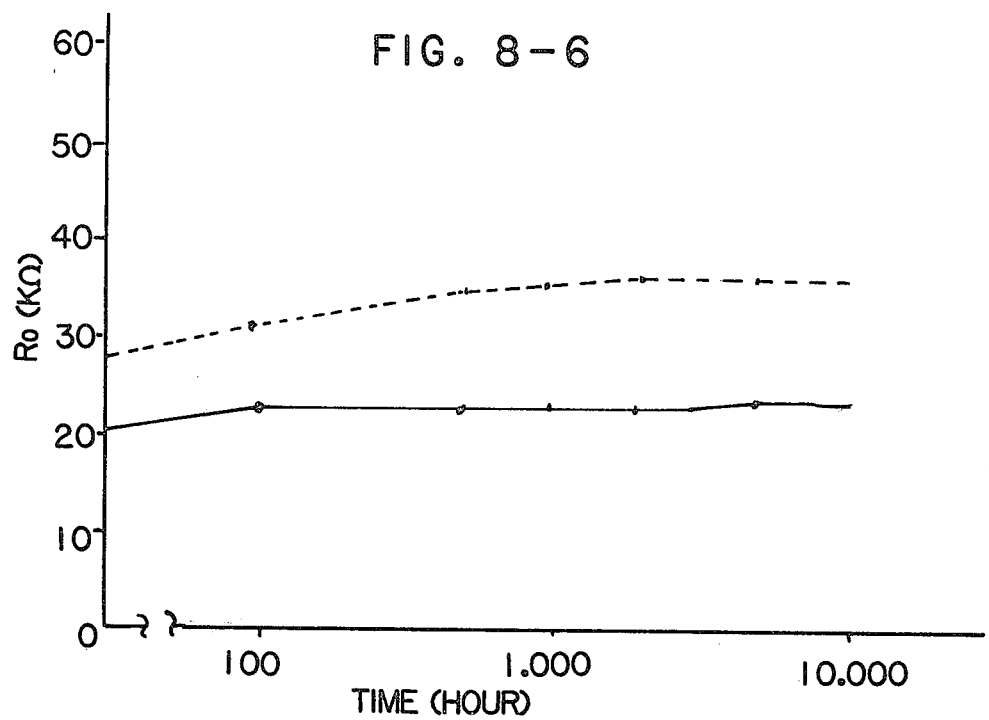

Also, changes with time in respect of series resonance resistance (Ro) were measured. These results are shown in FIGS. 8-1 to 8-6. Again, the solid lines represent samples of the invention and the dotted lines the comparative samples.

In the drawings, the first in each set, namely, FIGS. 7-1 and 8-1 show the case of using the $V_2O_3$ layer as the intermediate layer. Similarly, the second set, FIGS. 7-2 and 8-2 show the case of using the Ta layer; FIGS. 7-3 and 8-3 show the case of using the V layer; FIGS. 7-4 and 8-4 show the case of using the Cu layer; FIGS. 7-5 and 8-5 show the case of using the Ni layer; and FIGS. 7-6 and 8-6 show the case of the Ti layer.

It can be seen from all of FIGS. 7-1 to 8-6 that with tuning fork vibrators having the electrode structure of the present invention, changes with time in resonance frequency and changes in Ro are small compared with those for conventional vibrators.

Figure 9:
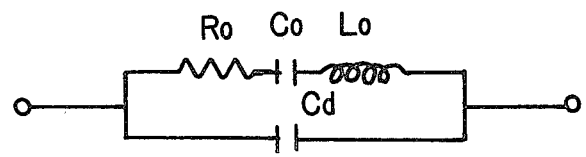
FIG. 9 is an equivalent circuit of a zinc oxide thin film.

Ro was measured as follows. An equivalent circuit for the zinc oxide thin film is illustrated in FIG. 9, wherein Cd is a parallel capacity, which is a value similar to an electrostatic capacity when the zinc oxide thin film is a condenser, Ro is a series resonance resistance, Co is an equivalent capacity and Lo is an equivalent inductance.

Figure 10:
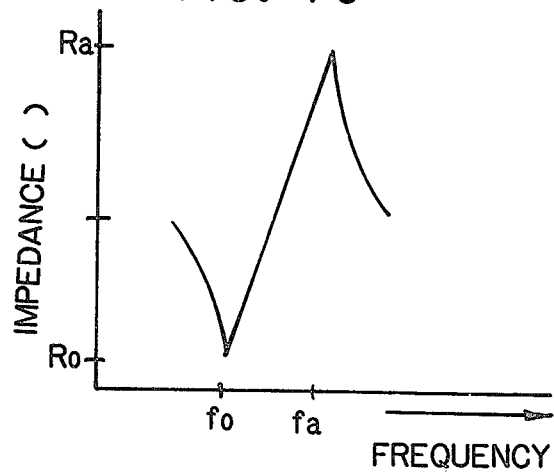
FIG. 10 is a graph showing the relation between impedance and frequency.

From the relation between impedance and frequency as illustrated in FIG. 10, Ro corresponds to a series resonance frequency (fo). It is therefore understood that as the value of Ro increases, the amplitude for resonance needs to be increased, leading to a reduction in resonance performance.

With tuning fork vibrators having the electrode structure of the present invention, as is apparent from FIGS. 8-1 to 8-6, changes with time in Ro are small as compared with those for conventional vibrators. This demonstrates that the electrode structure of the present invention has stable electrical characteristics even under high temperature conditions.

In summary, and in accordance with the present invention, the presence of an intermediate layer selected from the group consisting of $V_2O_3$, Ta, V, Cu, Ni or Ti as a diffusion preventing layer between the surface of the zinc oxide thin film and the Al electrode provides the zinc oxide thin film with sufficient electrical characteristics for practical use. In particular, there can be obtained films having high reliability, i.e., in which changes in Ro and resonance frequency under high temperature life test are all small.

The invention in its broader aspects is not limited to the specific details shown and described and departures may be made from such details without departing from the scope of the invention or sacrificing its chief advantages.

What is claimed is:

1. An electrode structure for a zinc oxide thin film comprising an Al electrode and an intermediate layer between the surface of the zinc oxide thin film and the Al electrode, wherein said intermediate layer is selected from the group consisting of $V_2O_3$, Ta, V, Cu, Ni and Ti.

2. The electrode structure of claim 1, wherein the Al electrode has a thickness of from 3,000 Å to 10,000 Å.

3. The electrode structure of claim 1, wherein the intermediate layer has a thickness of from 50 to 3000 Å.

4. The electrode structure of claim 1, wherein the intermediate layer is $V_2O_3$.

5. The electrode structure of claim 1, wherein the intermediate layer is V.

6. In a tuning fork vibrator having a zinc oxide thin film layer and an Al electrode layer, the improvement comprising an intermediate layer between the surface of the zinc oxide thin film layer and the Al electrode layer, said intermediate layer being selected from the group consisting of $V_2O_3$, Ta, V, Cu, Ni and Ti.

* * * * *